(12) United States Patent
Sakai

(10) Patent No.: US 6,246,242 B1
(45) Date of Patent: Jun. 12, 2001

(54) METHOD OF SCREENING VARISTORS

(75) Inventor: Seiji Sakai, Nagaokakyo (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/198,283

(22) Filed: Nov. 23, 1998

(30) Foreign Application Priority Data

Nov. 21, 1997 (JP) .................................... 9-321668

(51) Int. Cl.$^7$ ......................... G01R 31/02; H01H 31/12; H02H 9/00
(52) U.S. Cl. .............................. 324/549; 324/551; 361/56
(58) Field of Search .................................. 324/549, 551, 324/655, 711, 723; 361/56

(56) References Cited

U.S. PATENT DOCUMENTS

| | | | |
|---|---|---|---|
| 5,142,430 | * 8/1992 | Anthony | 361/56 |
| 5,225,783 | * 7/1993 | Suzuki | 324/655 |
| 5,652,621 | * 7/1997 | Meyer | 324/551 |

FOREIGN PATENT DOCUMENTS

| | | |
|---|---|---|
| 1061898 | 1/1959 | (DE) . |
| 60070658 | 8/1992 | (DE) . |

* cited by examiner

*Primary Examiner*—Safet Metjahic
*Assistant Examiner*—James C Kerveros
(74) *Attorney, Agent, or Firm*—Ostrolenk, Faber, Gerb & Soffen, LLP

(57) ABSTRACT

A method of screening varistors. In a first step, a pulse generator is caused to apply to a varistor a large-current pulse having a peak value of at least 1 A and 90% or less of an average breakdown current of the varistor and has a pulse width of 100 msec or less. In a second step, the dielectric loss of the varistor is measured through use of an LCR meter at a frequency of about 100 KHz or higher. Subsequently, in a third step, a judgment is made as to whether the measured value falls within a range that is preset as a reference value for judgment. If the measured value is within the range, the varistor is judged to be a non-defective product. If the measured value is outside of the range, the varistor is judged to be a defective product having an internal defect.

4 Claims, 4 Drawing Sheets

METHOD OF SCREENING VARISTORS

BACKGROUND OF THE INVENTION

1. Field of the Invention

The present invention relates to a method of screening varistors, particularly those employed as a measure for absorbing surges in electronic circuits and the like.

2. Related Art

There have been proposed various conventional methods for detecting presence/absence of an internal defect in a varistor, which is a voltage-nonlinear resistor (resistor whose resistance varies nonlinearly with applied voltage). In the method disclosed in Japanese Patent Publication (kokoku) No. 6-70658, a pulse is applied to a varistor such that if an internal defect is present, the varistor is destroyed. In the method disclosed in Japanese Patent Publication (kokoku) Nos. 4-66082 and 1-13201, the current-voltage characteristic of a varistor is measured and compared with that of a normal varistor in order to detect presence/absence of an internal defect in the varistor.

The method in which a pulse is applied to a varistor in order to destroy the varistor if an internal defect is present has drawbacks in that if the energy of the pulse is excessively high, the pulse deteriorates non-defective varistors, and if the energy of the pulse is excessively low, detection of defects becomes impossible. Therefore, strict setting and control of pulse energy have been required.

The method in which the current-voltage characteristic of a varistor is measured for the detection of presence/absence of internal defect makes use of a statistical correlation between presence of an internal defect in a varistor and variation in the current-voltage characteristic of the varistor. Thus, in order to reliably reject defective varistors, the conditions for screening non-defective varistors must be made stricter in order to narrow the screening range, leading to the possibility that non-defective products may also be rejected as defectives.

SUMMARY OF THE INVENTION

In view of the foregoing, an object of the present invention is to provide a method of screening varistors in which non-defective varistors are not deteriorated or rejected as defectives and which permits stable detection of presence/absence of internal defects.

In order to achieve the above object, the method of screening varistors according to the present invention is characterized in that dielectric loss of a varistor is measured after a current pulse is applied to the varistor, to thereby screen the varistor according to the measured dielectric loss.

Preferably, the current pulse is a large current pulse, that is, a current pulse having a peak value and pulse width which causes dielectric loss of a varistor to increase if the varistor has an internal defect and to remain substantially unchanged if the varistor does not have an internal defect.

The large-current pulse preferably has a peak value of at least 1 A and 90% or less of an average breakdown current of the varistors and has a pulse width of 100 msec or less. Preferably, the frequency for the measurement of dielectric loss is at least 100 KHz, and the measurement time is 1 sec or less.

When a large-current pulse is applied to a defective varistor having an internal defect, the region having the internal defect loses its nonlinearity and thereby serves as a resistor, which results in an increase in the value of dielectric loss. However, when a large-current pulse is applied to a non-defective varistor having no internal defect, the value of dielectric loss of the non-defective varistor does not increase. Accordingly, when the value of dielectric loss of a varistor measured after application of a large-current pulse does not fall within a predetermined range, the varistor can be judged to be a defective varistor having an internal defect.

According to the present invention, reliable detection of a defective product having an internal defect can be performed through a simple operation of measuring the dielectric loss of a varistor after application of a large-current pulse. Further, non-defective products are neither deteriorated nor rejected as defective products. Moreover, according to the above-described method, varistors which have a deteriorated surge resistance and a deteriorated surge absorbing performance due to existence of internal defects can be screened out within a short period of time. Accordingly, it becomes possible to screen all the varistors, so that the quality of the varistors can be improved. Further, even when varistors to be screened have different surge absorbing characteristics, a value of dielectric loss that serves as a reference value for judgment and that is preset when the varistors are screened is not required to change, if the varistors are formed of the same kind of material. Therefore, the method of the present invention can be applied to a production line for producing a plurality of kinds of varistors.

Other features and advantages of the present invention will become apparent from the following description of the invention which refers to the accompanying drawings.

DETAILED DESCRIPTION OF PREFERRED EMBODIMENT(S)

An embodiment of the method of screening varistors according to the present invention will be described with reference to the accompanying drawings.

Figure 1:
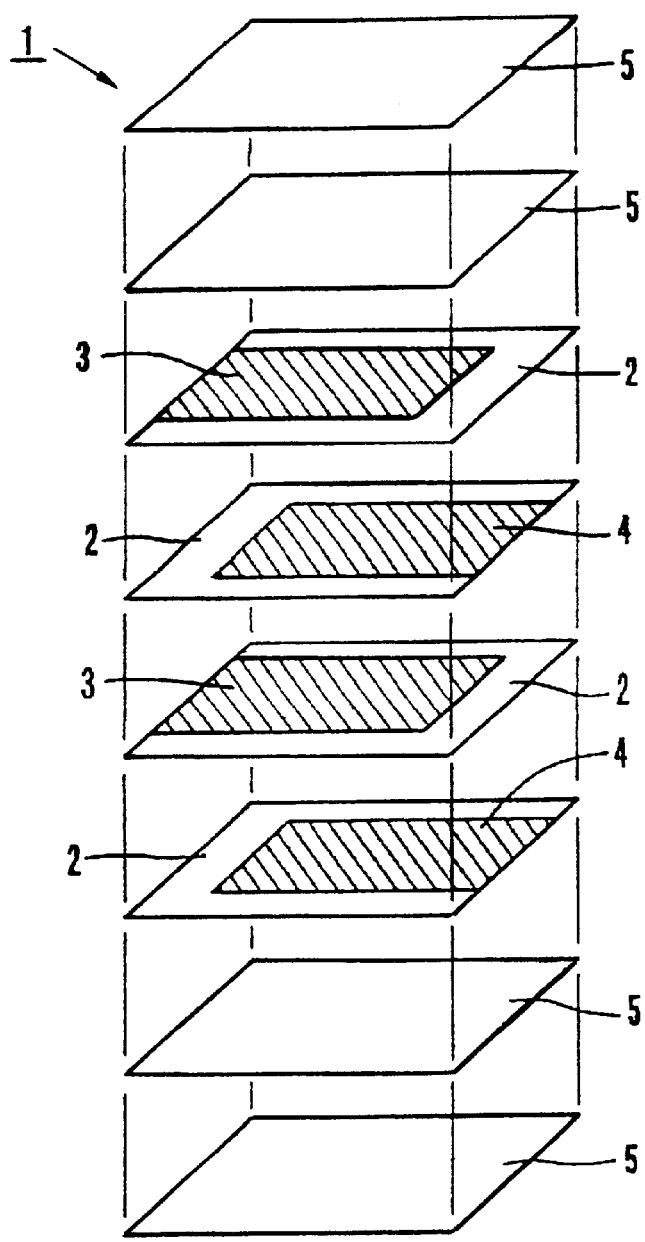
FIG. 1 is an exploded perspective view showing an example of a varistor.

FIG. 1 is an exploded perspective view of a varistor 1 having a plurality of ceramic sheets. Each of the ceramic sheets 2 is formed by kneading and forming an inorganic binder including powder that contains ZnO, $BaTiO_3$, $SrTiO_3$, or the like as a main component into a sheet-like shape. An internal electrode 3 or 4 is formed on the top surface of each ceramic sheet 2 through printing or a like method. The internal electrodes 3 and 4 are formed of conductive paste such as Ag paste, Ag—Pd paste, or Cu paste. The thus-prepared ceramic sheets 2 are superposed on one another in an alternating fashion. Further, protection sheets 5 are disposed on the upper and lower sides of the resultant stack of ceramic sheets 2, and the sheets are then integrally pressed for mutual contact to thereby be formed into a laminate. The laminate is then fired.

Figure 2:
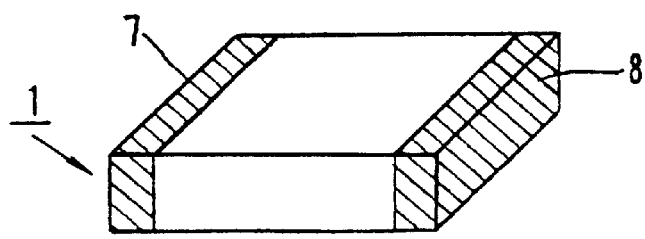
FIG. 2 is a perspective view showing the appearance of the varistor shown in FIG. 1.
Figure 3:
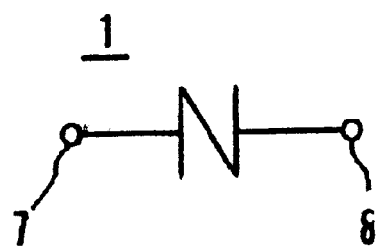
FIG. 3 is an electrical equivalent circuit of the varistor shown in FIG. 2.

Subsequently, as shown in FIG. 2, an external electrode 7 is formed on the left end surface of the laminate, and an external electrode 8 is formed on the right end surface of the laminate. End portions of the internal electrodes 3 are electrically connected to the external electrode 7, while end portions of the internal electrodes 4 are electrically connected to the external electrode 8. Thus, there is obtained a laminated-type varistor 1 having an electrical equivalent circuit shown in FIG. 3.

Figure 4:
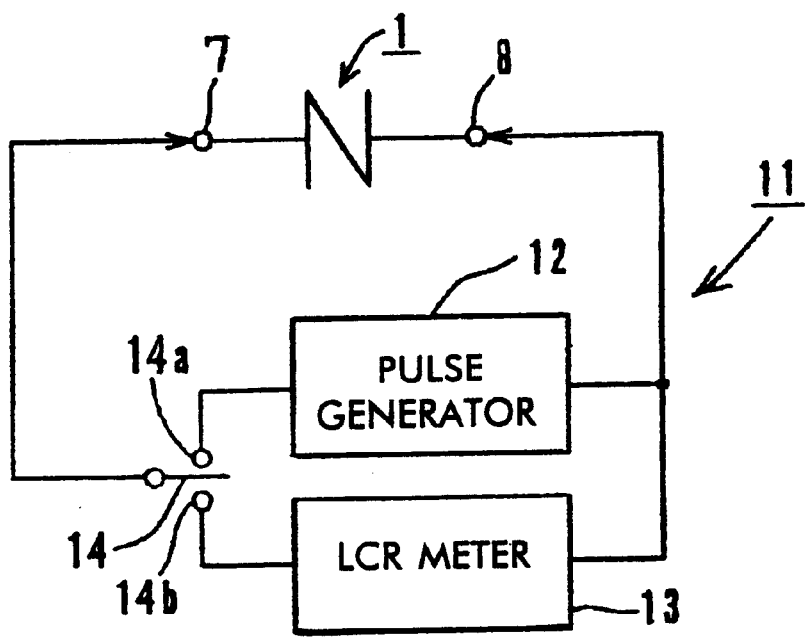
FIG. 4 is an electrical block diagram showing an example of a screening apparatus used in the method of screening varistors according to the present invention.

The thus-obtained laminated-type varistor 1 is set on a screening apparatus 11 shown in FIG. 4. The screening apparatus 11 includes a pulse generator 12, an LCR meter (so-called Q-meter) 13, a changeover switch 14, and an unillustrated microcomputer. The pulse generator 12 generates a large-current pulse having a peak value of at least 1 A and 90% or less of an average breakdown current of the varistor 1. If the peak value is smaller than 1 A, conversion of an internal defect to a resistor (which will be described later) does not occur. If the peak value exceeds 90% of the average breakdown current of the varistor 1, there arises a possibility that the pulse deteriorates non-defective products. Further, the pulse width of the large-current pulse is preferably set to 100 msec or less. If the pulse width exceeds 100 msec, the varistor 1 generates heat upon application of the large-current pulse, resulting in deterioration of the varistor 1.

The LCR meter 13 is a measurement device for measuring Q of a capacitor through utilization of resonance of a circuit containing the capacitor. The LCR meter 13 can measure the capacitance and dielectric loss (tan *) of the varistor 1. The LCR meter 13 is electrically connected in parallel to the pulse generator 12. One end of each of the pulse generator 12 and the LCR meter 13 is connected to the external electrode 7 of the varistor 1 via the switch 14, while the other end thereof is directly connected to the external electrode 8 of the varistor 1.

Figure 5:
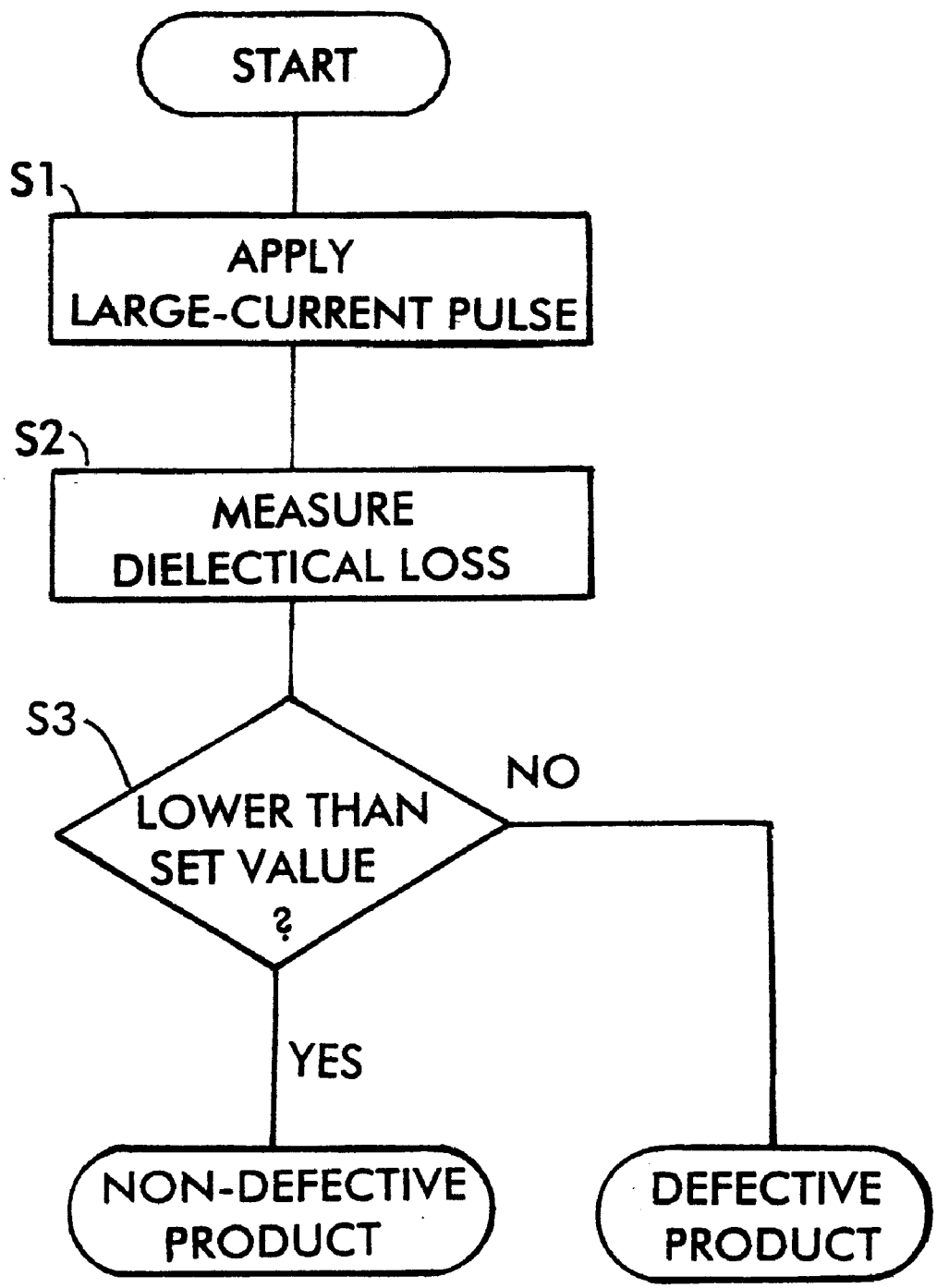
FIG. 5 is a flow chart showing an embodiment of the method of screening varistors according to the present invention.

With reference to the flowchart shown in FIG. 5, a description will be given of a method of screening the varistor 1 through use of the screening apparatus 11 having the above-described structure.

When the screening apparatus 11 is started, in step S1, the changeover switch 14 is switched to the side of a contact 14a in response to a signal from the unillustrated microcomputer. Thus, the pulse generator 12 is connected to the varistor 1. Subsequently, a large-current pulse from the pulse generator 12 is applied to the varistor 1. When the varistor 1 is of a ZnO type, for example, the peak value of the large-current pulse is adjusted to have a peak value of 1 A and a pulse width of 10 msec.

Figure 6:
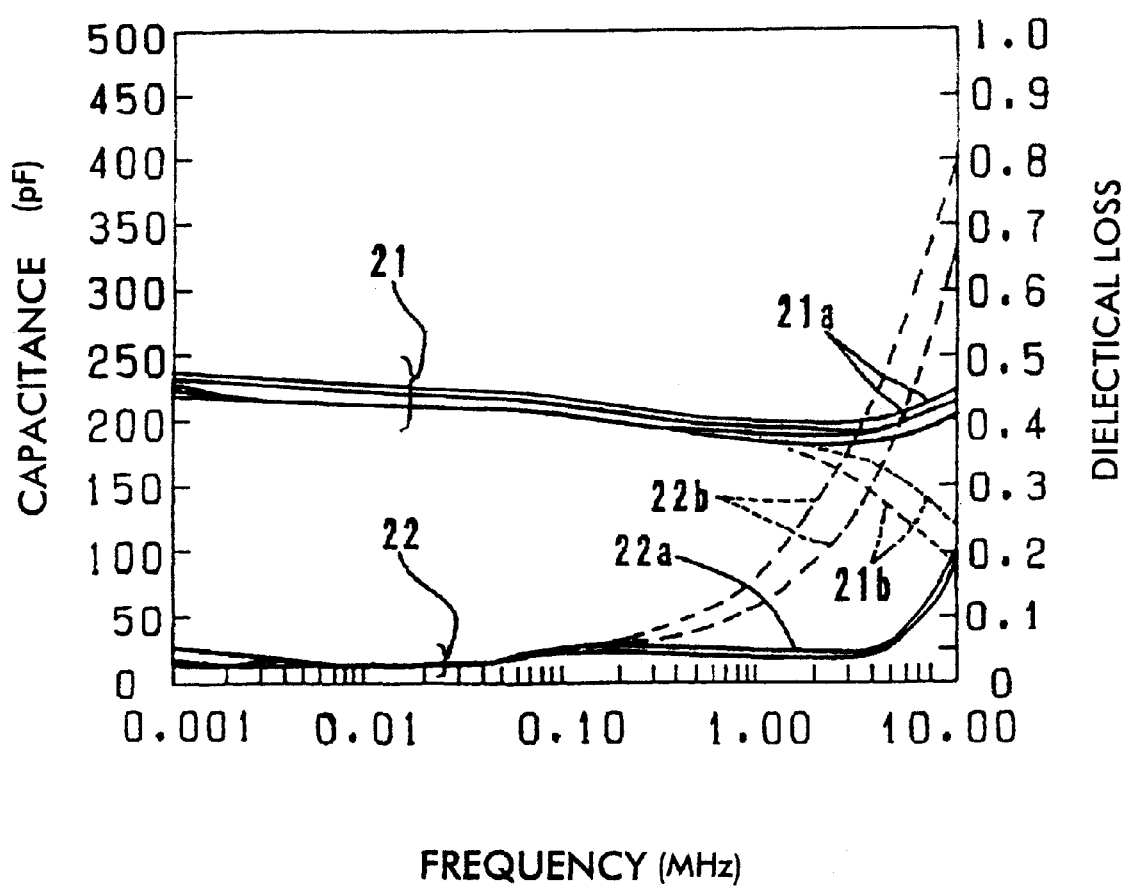
FIG. 6 is a graph showing capacitance characteristics and dielectric-loss characteristics of varistors.

As shown in FIG. 6, when a large-current pulse is applied to a defective varistor 1 having an internal defect, the area having the internal defect loses its nonlinearity and thereby serves as a resistor, which results in an increase in the value of dielectric loss (see broken lines 22b). By contrast, when a large-current pulse is applied to a non-defective varistor 1 having no internal defect, the value of dielectric loss does not increase (see solid lines 22a). In the graph of in FIG. 6, reference symbol 22 denotes characteristic curves obtained in an experiment in which dielectric loss was measured while frequency was changed, the solid lines 22a being the characteristic curves of non-defective products, and the broken lines 22b being the characteristic curves of defective products. Further, reference symbol 21 denotes characteristic curves obtained in an experiment in which capacitance was measured while frequency was changed, the solid lines 21a being the characteristic curves of non-defective products, and the broken lines 21b being the characteristic curves of defective products. As described later, measuring the dielectric loss of a varistor while changing the frequency is not a general practice. Therefore, the dielectric loss is measured only at a predetermined frequency. After application of the large-current pulse for a predetermined period of time, the pulse generator 12 is stopped in accordance with a signal from the microcomputer.

Subsequently, in step S2, the changeover switch 14 is switched from the side of the contact 14a to the side of a contact 14b in order to connect the LCR meter 13 to the varistor 1. If the varistor 1 has an internal defect, as shown in FIG. 6, increase of the dielectric loss becomes remarkable when the frequency exceeds about 100 KHz. Therefore, the LCR 13 is set to measure the dielectric loss of the varistor 1 at a frequency of 100 KHz or higher. In the case where the varistor 1 is of a ZnO type, for example, the dielectric loss of the varistor 1 is measured by use of a measurement voltage of 1 Vrms and at a frequency of 1 MHz. The measurement time for measuring the dielectric loss of the varistor 1 is set to 1 sec or less.

Subsequently, in step S3, the measured value is sent to the microcomputer, which makes a judgment as to whether the measured value falls within a predetermined, preset range of dielectric loss. In general, the value of dielectric loss used as a reference for judgment is set such that it does not exceed a value about 1.1 to 5 times the average dielectric loss of varistors 1 to be screened. The average dielectric loss of the varistors 1 depends on the material of the varistors 1. For example, when the varistors are of a ZnO type, the average dielectric loss is 2–5%. Accordingly, 5% is set as a reference value that the microcomputer uses as a reference for judgment. The microcomputer judges whether the measured value exceeds 5%, which is the preset reference value for judgment. If the measured value is not greater than 5%, the measured varistor 1 is judged to be a non-defective product. If the measured value is greater than 5%, the measured varistor 1 is judged to be a defective product.

The above-described method enables reliable detection of a defective product having an internal defect through a simple operation of measuring the dielectric loss of a varistor after application of a large-current pulse. Also, non-defective products are neither deteriorated nor rejected as defective products. Further, according to the above-described method, varistors which have a deteriorated surge resistance and a deteriorated surge absorbing performance due to existence of internal defects can be screened out within a short period of time. Accordingly, it becomes possible to screen all the varistors 1, so that the quality of the varistors 1 can be improved. Further, even when varistors to be screened have different surge absorbing characteristics, a value of dielectric loss that serves as a reference value for judgment and that is preset within the microcomputer when the varistors are screened is not required to change, if the varistors are formed of the same kind of material. Therefore, the above-described method can be applied to a production line for producing a plurality of kinds of varistors.

The method of screening varistors according to the present invention is not limited to the above-described embodiment and may be modified in various ways within the scope of the present invention. For example, the screening apparatus is not limited to the above-described embodiment, and may be configured in different ways in accordance with the specification of varistors to be screened.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A method of screening varistors comprising the steps of:

applying a current pulse to a varistor;

measuring dielectric loss of the varistor; and screening the varistor according to the measured dielectric loss.

2. A method of screening varistors comprising the steps of:

applying a current pulse to a varistor, said current pulse having a peak value and pulse width which causes dielectric loss of the varistor to increase if the varistor has an internal defect and to remain substantially unchanged if the varistor has no internal defect;

measuring dielectric loss of the varistor; and determining whether the varistor has an internal defect according to the measured dielectric loss.

3. A method of screening varistors according to claim 2, wherein said current pulse has a peak value of at least 1 A and 90% or less of an average breakdown current of the varistors and has a pulse width of 100 msec or less.

4. A method of screening varistors according to claim 3, wherein said frequency for measurement of dielectric loss is at least 100 KHz and the measurement time is 1 sec or less.

* * * * *